(12) United States Patent
Auchere et al.

(10) Patent No.: US 10,811,349 B2
(45) Date of Patent: Oct. 20, 2020

(54) ELECTRONIC DEVICE INCLUDING AT LEAST ONE ELECTRONIC CHIP AND ELECTRONIC PACKAGE

(71) Applicants: STMicroelectronics (Grenoble 2) SAS, Grenoble (FR); STMicroelectronics (Alps) SAS, Grenoble (FR)

(72) Inventors: David Auchere, Meylan (FR); Laurent Schwarz, La Buisse (FR); Deborah Cogoni, Notre Dame de l'Osier (FR); Eric Saugier, Froges (FR)

(73) Assignees: STMicroelectronics (Grenoble 2) SAS, Grenoble (FR); STMicroelectronics (Alps) SAS, Grenoble (FR)

( * ) Notice: Subject to any disclaimer, the term of this patent is extended or adjusted under 35 U.S.C. 154(b) by 162 days.

(21) Appl. No.: 16/110,121

(22) Filed: Aug. 23, 2018

(65) Prior Publication Data

US 2019/0067180 A1    Feb. 28, 2019

(30) Foreign Application Priority Data

Aug. 25, 2017  (FR) ...................... 17 57878

(51) Int. Cl.
*H01L 23/498* (2006.01)
*H01L 23/538* (2006.01)
(Continued)

(52) U.S. Cl.
CPC ........ *H01L 23/49838* (2013.01); *H01L 23/13* (2013.01); *H01L 23/3128* (2013.01);
(Continued)

(58) Field of Classification Search
CPC .......... H01L 23/49838; H01L 23/5389; H01L 23/49833; H01L 23/49822; H01L 23/13;
(Continued)

(56) References Cited

U.S. PATENT DOCUMENTS

| | | | |
|---|---|---|---|
| 6,867,668 B1 * | 3/2005 | Dagostino | H01L 23/66 257/E23.065 |
| 2002/0139571 A1 * | 10/2002 | Mizunashi | H01L 23/49816 174/255 |

(Continued)

FOREIGN PATENT DOCUMENTS

WO    03094203 A2    11/2003

OTHER PUBLICATIONS

INPI Search Report and Written Opinion for FR 1757878 dated May 9, 2018 (8 pages).

*Primary Examiner* — Zandra V Smith
*Assistant Examiner* — Jeremy J Joy
(74) *Attorney, Agent, or Firm* — Crowe & Dunlevy

(57) ABSTRACT

An electronic device includes a support wafer, an electronic chip and an encapsulating block for the electronic chip above the support wafer. The support wafer is provided with a first network of electrical connections and a second network of electrical connections formed solely by tracks. First electrical connection elements are interposed between first front electrical contacts of the electronic chip and rear electrical contacts of the first network. Second electrical connection elements are interposed between second front electrical contacts of the electronic chip and internal electrical contact zones of the tracks of the second network. The first network includes front external electrical contacts and the tracks exhibiting external electrical contact zones.

19 Claims, 4 Drawing Sheets

(51) Int. Cl.

| | |
|---|---|
| *H01L 23/00* | (2006.01) |
| *H05K 1/18* | (2006.01) |
| *H01L 23/31* | (2006.01) |
| *H01L 23/13* | (2006.01) |
| *H01L 21/56* | (2006.01) |
| *H01L 21/78* | (2006.01) |

(52) U.S. Cl.
CPC .. *H01L 23/49822* (2013.01); *H01L 23/49833* (2013.01); *H01L 23/5389* (2013.01); *H01L 24/00* (2013.01); *H01L 24/16* (2013.01); *H05K 1/185* (2013.01); *H01L 21/561* (2013.01); *H01L 21/78* (2013.01); *H01L 24/97* (2013.01); *H01L 2224/16227* (2013.01); *H01L 2224/16235* (2013.01); *H05K 2201/10621* (2013.01); *H05K 2201/10636* (2013.01)

(58) Field of Classification Search
CPC ..... H01L 23/3128; H01L 23/50; H01L 24/13; H01L 24/00; H01L 24/16; H05K 1/185
See application file for complete search history.

(56) References Cited

U.S. PATENT DOCUMENTS

| | | | |
|---|---|---|---|
| 2003/0222282 A1* | 12/2003 | Fjelstad | H01L 23/49805 257/200 |
| 2004/0169198 A1* | 9/2004 | Nagata | H01L 23/49822 257/200 |
| 2005/0230852 A1* | 10/2005 | Lee | H01L 23/49838 257/787 |
| 2006/0065975 A1* | 3/2006 | Mosley | H01L 23/49805 257/723 |
| 2006/0103004 A1* | 5/2006 | Sakai | H01L 23/49822 257/700 |
| 2008/0290495 A1* | 11/2008 | Uematsu | H01L 23/66 257/691 |
| 2009/0145636 A1* | 6/2009 | Miki | H01L 21/6835 174/255 |
| 2015/0103489 A1 | 4/2015 | Auchere et al. | |
| 2016/0056094 A1* | 2/2016 | Muniandy | H01L 24/97 257/675 |
| 2019/0252102 A1* | 8/2019 | Marin | H01F 1/20 |

* cited by examiner

ELECTRONIC DEVICE INCLUDING AT LEAST ONE ELECTRONIC CHIP AND ELECTRONIC PACKAGE

PRIORITY CLAIM

This application claims the priority benefit of French Application for Patent No. 1757878, filed on Aug. 25, 2017, the content of which is hereby incorporated by reference in its entirety to the maximum extent allowable by law.

TECHNICAL FIELD

Embodiments relate to electronic devices and electronic packages.

SUMMARY

According to one embodiment, an electronic device comprises: a support wafer exhibiting a front face and a rear face, at least one electronic chip a front face of which is opposite the rear face of the support wafer and an encapsulating block for the chip above the support wafer.

The support wafer is provided with a first network of electrical connections, establishing electrical connections from one face to the other, and with a second network of electrical connections comprising solely tracks.

First electrical connection elements are interposed between first front electrical contacts of the chip and rear electrical contacts of the first network of electrical connections of the support wafer and second electrical connection elements are interposed between second front electrical contacts of the chip and internal electrical contact zones of the tracks of the second network of electrical connections of the support wafer.

The first network of electrical connections of the support wafer comprises front external electrical contacts and the tracks of the second network of electrical connections of the support wafer exhibit external electrical contact zones.

Thus, the break in impedance of the electrical connections that are embodied by the second network of electrical connections can be reduced.

The support wafer can exhibit at least one recess on the side of its front face, uncovering the external electrical contact zones, oriented front-wards, of the tracks of the second network of electrical connections.

The external electrical contact zones of the tracks can be situated in correspondence with a region of the encapsulating block.

The support wafer can extend beyond the periphery of the encapsulating block, the external electrical contact zones of the tracks of the second network of electrical connections being oriented front-wards and situated at the periphery and remote from the periphery of the encapsulating block.

The support wafer can comprise a first part provided with the first network of electrical connections and a second part provided with the second network of electrical connections and exhibiting an internal portion between the encapsulating block and the first part and an external portion extending beyond the periphery of the encapsulating block and the first part.

The second part of the support wafer can comprise at least one film provided with the second network of electrical connections.

The first front electrical contacts and the second front electrical contacts of the chip can be respectively in a middle region and in a peripheral region of a front face of the chip.

The first electrical contacts of the chip can be electrical power supply contacts and the second electrical contacts of the chip can be contacts for exchanges of electrical signals.

There is also proposed an electronic package which comprises an electronic device and an electronic board.

In this package, the front electrical contacts of the first network of electrical connections of the support wafer and the external electrical contact zones of the tracks of the second network of electrical connections of the support wafer are respectively connected to electrical contacts of a first and of a second network of electrical connections of the electronic board.

The support wafer of the electronic device can be at least in part engaged in a recess of the electronic board.

The package can comprise an intermediate annulus provided with electrical connection branches connecting the external electrical contact zones of the tracks and the electrical contacts of the second network of electrical connections of the electronic board.

BRIEF DESCRIPTION OF THE DRAWINGS

Electronic devices and electronic packages will now be described by way of non-limiting examples, illustrated by the appended drawing in which.

DETAILED DESCRIPTION

Figure 1:
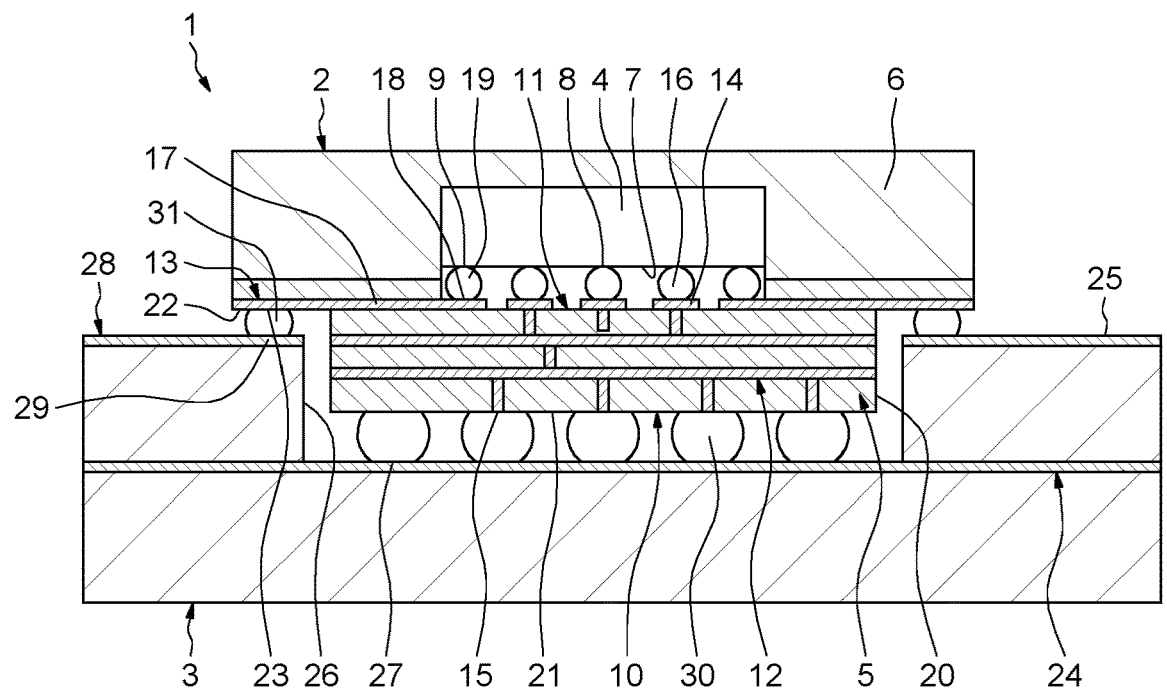
FIG. 1 represents a transverse section through an electronic package comprising an electronic device mounted on an electronic board.
Figure 2:
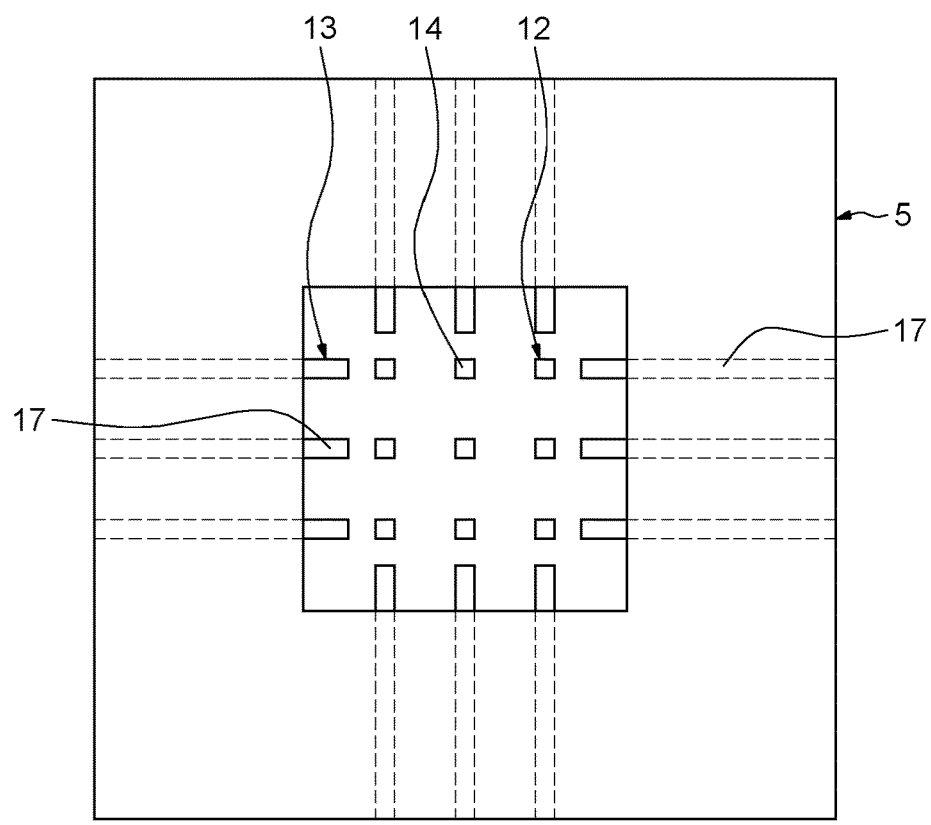
FIG. 2 represents a view from the rear towards the front of a support wafer of the electronic device of FIG. 1.
Figure 3:
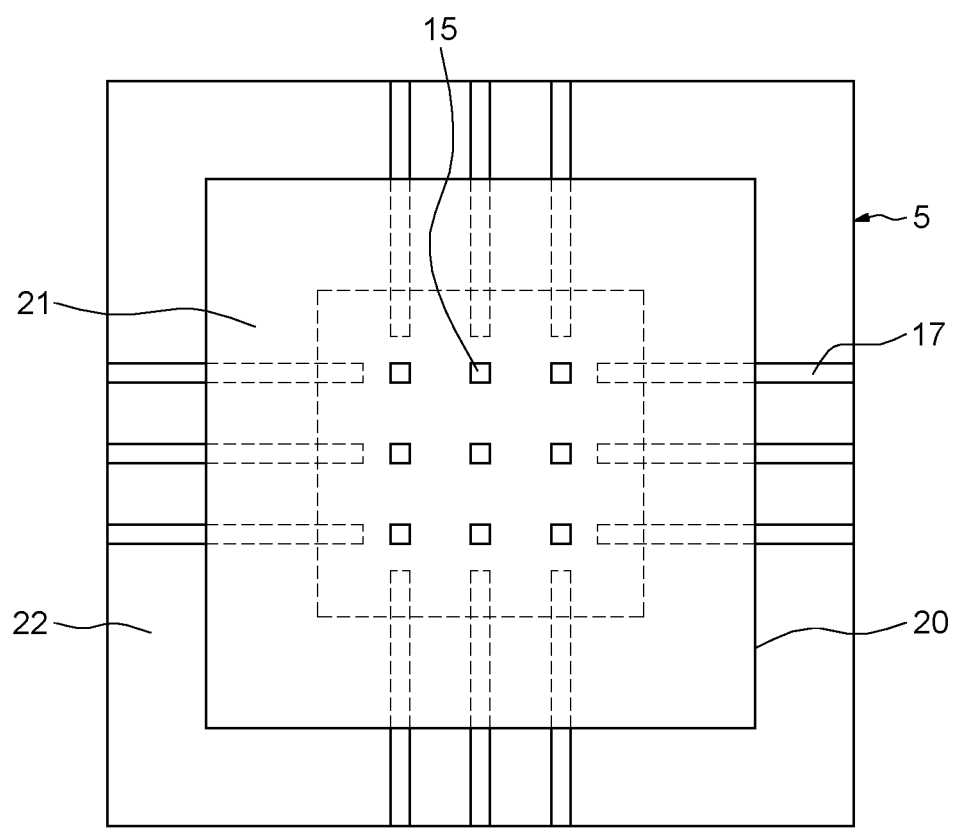
FIG. 3 represents a view from the front towards the rear of the support wafer of the electronic device of FIG. 1.

According to an exemplary embodiment illustrated in FIGS. 1 to 3, an electronic package 1 comprises an electronic device 2 mounted on an electronic board 3.

The electronic device 2 comprises an electronic chip 4, with square or rectangular contour, mounted above a dielectric support wafer 5, with corresponding square or rectangular contour, and a block 6 for encapsulating the chip 4 above the support wafer 5, whose contour follows the contour of the support wafer 5.

The chip 4 exhibits a front face 7 provided with a first group of first electrical contacts 8 and a second group of second electrical contacts 9. The first electrical contacts 8 are situated on a middle region of the face 7 and the second electrical contacts 9 are situated on a peripheral region of the front face 7 which surrounds the middle region.

The support wafer 5 exhibits a front face 10 and a rear face 11. The chip 4 is situated above a middle region of the rear face 11 of the support wafer 5.

The support wafer 5 is made of a dielectric material, for example at least one organic material, and is provided with a first integrated network of electrical connections 12 and a second integrated network of electrical connections 13.

The first network of electrical connections 12 realizes electrical connections from one face (10/11) to the other face (11/10) of the support wafer 5 and comprises integrated tracks formed in so-called "metallic" levels of the support wafer 5, parallel to its rear and front faces, and integrated vias which selectively link these tracks and on the one hand rear electrical contacts 14 of the rear face 11 and external front electrical contacts 15 of the front face 10.

The first electrical contacts of the chip 4 and the rear electrical contacts 14 of the support wafer 5 are, for example, respectively opposite and are linked by interposition of first electrical connection elements 16 such as balls.

The second integrated network of electrical connections 13 is formed solely of integrated tracks 17 formed in a metallic level of the support wafer 5, for example in a first metallic level situated on the side of the wafer which is adjacent or facing the chip 4.

The tracks 17 exhibit uncovered internal rear zones 18, forming electrical contacts, situated opposite the second electrical contacts 9 of the chip 4. Electrical connection elements 19 such as balls are interposed between the electrical contacts 9 of the chip 4 and the uncovered internal rear zones 18 of the tracks 17.

The support wafer 5 exhibits a front lateral recess 20 produced towards the rear in its rear face 10 so that the rear face 10 exhibits a middle region 21 provided with the front electrical contacts 15 of the first network of electrical connections 12 and a region 22 set back towards the rear which uncovers external front zones 23, forming front electrical contacts, of the tracks 17 of the second network of electrical connections 13. The external electrical contact zones 23 are oriented front-wards (facing away from the chip 4) and are situated in correspondence with a peripheral region of the encapsulating block 6.

For example, as illustrated in the figures, the front lateral recess 20 extends over the whole periphery of the support wafer 5 and the tracks 17 extend, for example, respectively perpendicularly to and away from the sides of the support wafer 5 defined by the lateral recess 20.

The encapsulating block 6, based on epoxy resin and of parallelepipedal exterior shape, encases the chip 4 and covers the peripheral part of the rear face 11 of the support wafer 5. The encapsulating block 6 comprises a part between the chip 4 and the support wafer 5, made of an identical or other epoxy resin, in which the electrical connection elements 16 and 19 are encased.

Advantageously, the chip 4 is provided so that its first electrical contacts 8 are electrical power supply contacts and that its second electrical contacts 9 are signal exchange contacts.

Thus, on the one hand the electrical power supply of the chip 4 is achieved by way of the first network of electrical connections 12 of the support wafer 5 and of at least some of the electrical connection elements 16 and, on the other hand, the exchanges of signals deemed to be among the most critical are achieved by way of the second network of electrical connections 13 of the support wafer 5 and of at least some of the electrical connection elements 19.

The signal exchange pathways, between the electrical contacts 9 of the chip 4 and the electrical contacts 23, are direct and reduced to the tracks 17 of the second network of electrical connections 13 and to the electrical connection elements 19, so as to reduce the break in impedance and to limit electrical losses and disturbances, this being particularly advantageous when the signals exchanged are high-frequency exchange signals or sensitive to a break in impedance.

The electronic device 1 can be fabricated in the following manner.

Having a parallelepipedal-shaped substrate wafer 5 provided with the electrical connection networks 12 and 13, the chip 4 is mounted by way of the electrical connection elements 16 and 19.

Next, the encapsulating block 6 is produced.

Next, the periphery of the support wafer 5 is thinned down from the front towards the rear so as to produce the peripheral front lateral recess 20 and to uncover the front zones 23 of the tracks 17 of the second network of electrical connections.

The electronic device 1 can result from collective fabrication in the following manner.

Having a parallelepipedal-shaped collective substrate wafer 5 provided in sites, respectively of the electrical connection networks 12 and 13, a chip 4 is mounted on each site by way of electrical connection elements 16 and 19.

Next, a collective encapsulating block 6 is produced.

Next, the support wafer 5 is thinned down from the front towards the rear so as to produce, in the rear face, grooves that cross one another and intended to form, in half, recesses 20 of the devices to be obtained.

Next, a singulation is undertaken by sawing along the lines of separation of the sites so as to obtain a plurality of electronic devices 1.

The electronic board 3 is provided with a first network of electrical connections 24 and exhibits, from a face 25, a local cavity 26 the bottom of which is provided with first electrical contacts 27 depth-wise for this first network 24.

The electronic board 3 is provided with a second network of electrical connections 28 and the face 25 is provided with second electrical contacts 29 of this second network 28.

The electronic device 2 is mounted on the electronic board 3 in a position such that the front middle part of the support wafer 5, delimited at its periphery by the recess 20, is engaged, remotely, in the cavity 26 of the electronic board 3 and that the periphery of reduced thickness of the substrate wafer 5, corresponding to the recess 20, is above the region of the face 25 adjacent to the cavity 26.

Electrical connection elements 30, such as balls, are interposed between the electrical contacts 15 of the first network of electrical connections 12 of the support wafer 5 of the electronic device 2 and the electrical contacts 27 of the first network of electrical connections 24 of the electronic board 3.

Electrical connection elements 31, such as balls, are interposed between the electrical contact zones 22 of the tracks 17 of the second network of electrical connections 13 of the support wafer 5 of the electronic device 2 and the electrical contacts 29 of the second network of electrical connections 28 of the electronic board 3.

Figure 4:
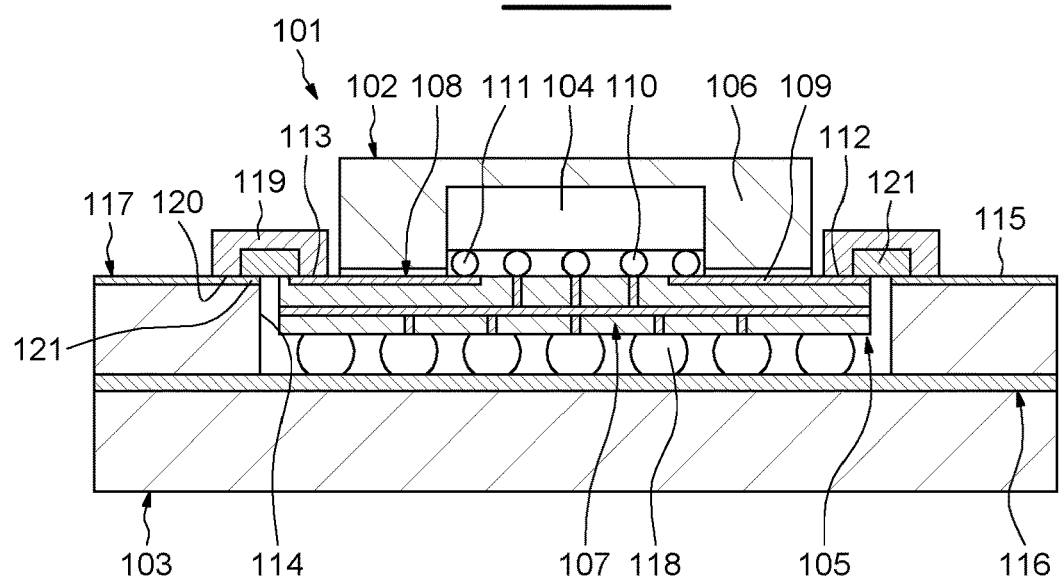
FIG. 4 represents a transverse section through another electronic package comprising another electronic device mounted on another electronic board.
Figure 5:
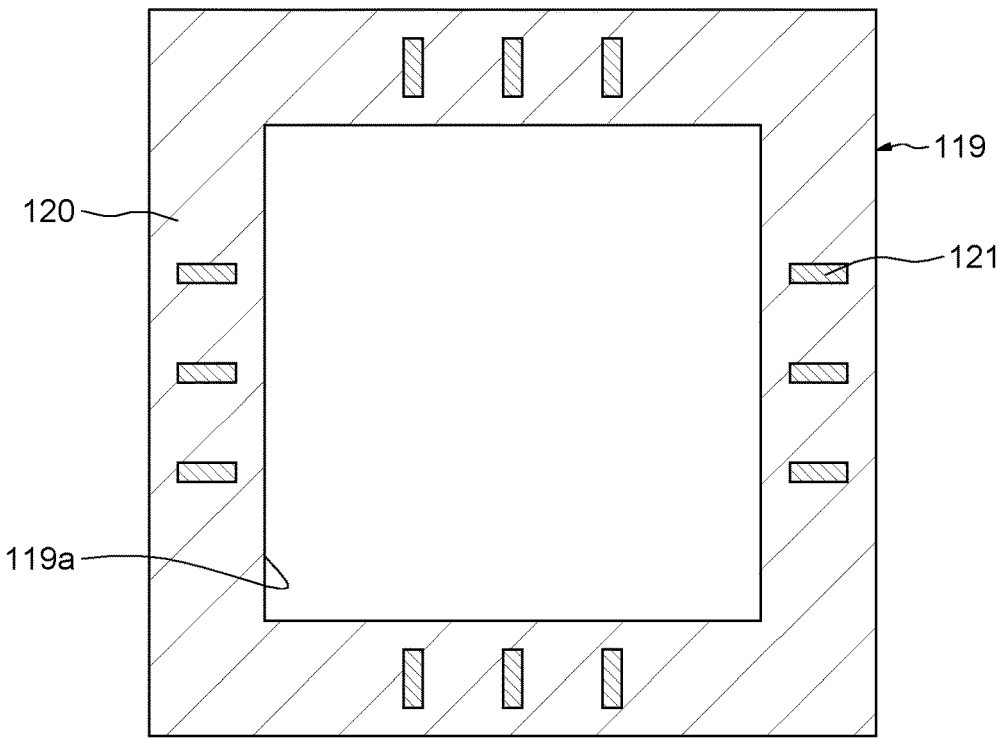
FIG. 5 represents a view from the front towards the rear of an intermediate annulus of the electronic package of FIG. 4.

According to an exemplary embodiment illustrated in FIGS. 4 and 5, there is illustrated, in an equivalent manner to the package 1, an electronic package 101 comprising an electronic device 102 and an electronic board 103 on which the electronic device 102 is mounted.

In an equivalent manner to the electronic device 2, the electronic device 102 comprises an electronic chip 104 mounted on a support wafer 105 and an encapsulating block 106 for the chip on the support wafer 105.

This time, however, the substrate wafer 105 is of parallelepipedal shape, the recess 20 of the electronic device 2 being non-existent here. Furthermore, the support wafer 105 extends beyond the periphery of the encapsulating block.

In an equivalent manner to the electronic device 2, the support wafer 105 is provided with a first integrated network of electrical connections 107, from one face to the other, and a second network of electrical connections 108 composed of tracks 109.

First electrical connection elements 110 are interposed between first front electrical contacts of the chip 104 and rear electrical contacts of the first network of electrical connections 107 of the support wafer 105.

Second electrical connection elements 111 are interposed between second front electrical contacts of the chip 104 and internal rear zones forming rear electrical contacts of the tracks 109 of the second network of electrical connections 108 of the support wafer 105.

This time, however, the tracks 109 of the second network of electrical connections 108 exhibit uncovered external rear zones 112, forming electrical contacts, which are included in the annular rear face 113 of the support wafer 105, situated around the encapsulating block 106. The external electrical contact zones 112 of the tracks 109 are oriented rear-wards and formed at the periphery and remote from the periphery of the encapsulating block 106.

In an equivalent manner to the electronic board 3, the electronic board 103 exhibits a cavity 114 in a face 115 and is provided with a first network of electrical connections 116 and with a second network of electrical connections 117.

The package 101 is arranged in the following manner.

The electronic device 102 is installed in a position such that the support wafer 105 is engaged remotely in the cavity 114 of the electronic board 103 and that the rear face 113 of the support wafer 105, including the zones of external electrical contacts 112 of the tracks 109, is at the level of the face 115 of the electronic board 103.

In an equivalent manner to the package 1, electrical connection elements 118 are interposed between front electrical contacts of the first network of electrical connections 107 of the support wafer 105 and electrical contacts of the first network of electrical connections 116 situated at the bottom of the cavity 114.

The package 101 further comprises an intermediate annulus 119 which is disposed around the encapsulating block 106 and which exhibits an interior flank 119a situated remotely from the periphery of the encapsulating block 106. A front face 120 of the intermediate annulus 119 exhibits an interior part situated opposite the rear face 113 of the support wafer 105 and an exterior part situated opposite the face 115 of the electronic board 103.

As illustrated more specifically in FIGS. 4 and 5, the front face 120 of the annulus 118 is provided with local electrical contact branches 121 achieving respectively electrical connections between the external rear electrical contact zones 112 of the tracks 109 of the second network of electrical connections 108 of the support wafer 105 and electrical contacts 121 of the second network of electrical connections 117 of the electronic board 103.

Figure 6:
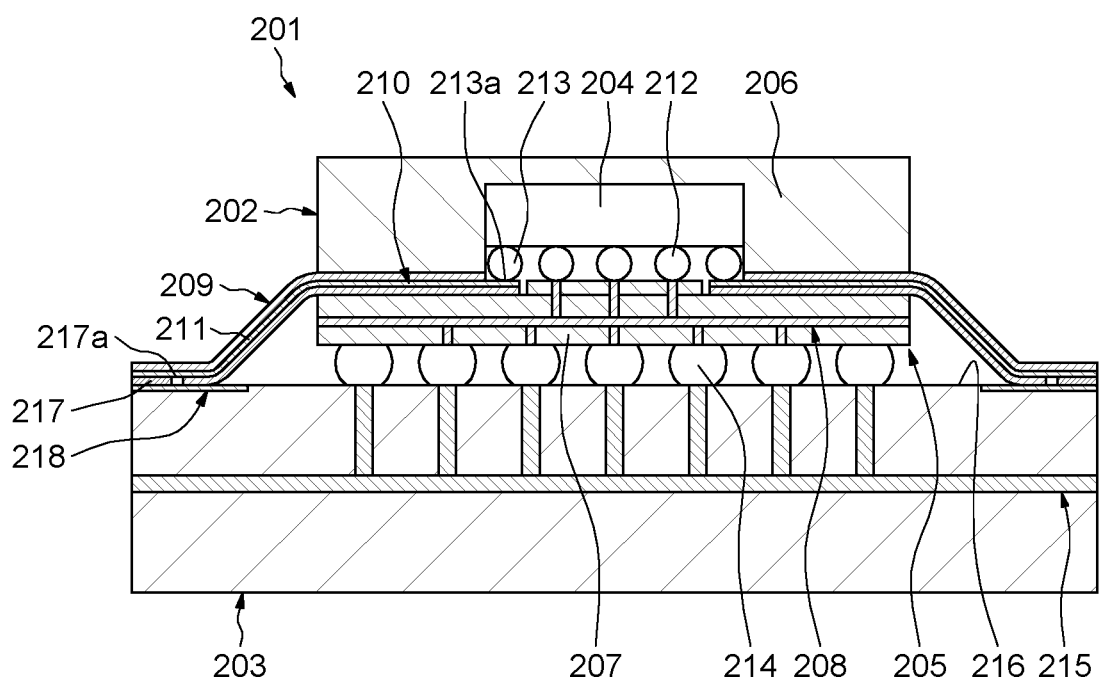
FIG. 6 represents a transverse section through another electronic package comprising another electronic device mounted on another electronic board.

According to another exemplary embodiment illustrated in FIG. 6, in an equivalent manner to the packages 1 and 101 described previously, an electronic package 201 comprises an electronic device 202 and an electronic board 203 on which the electronic device 202 is mounted.

In an equivalent manner to the electronic devices described previously, the electronic device 202 comprises an electronic chip 204 mounted on a support wafer 205 and an encapsulating block 206 for the chip on the support wafer 205.

This time, however, the support wafer 205 comprises a part 207 including a first network of electrical connections 208 and a part 209 including a second network of electrical connections 210.

The part 209 comprises a film including the network of electrical connections 210 in the form of tracks 211 and exhibits an internal portion situated on the side of the chip 204 and adjoining the part 207 and an overhanging external portion extending outwards, laterally to the part 207 and to the encapsulating block 206. The film forming the part 209 can extend beyond two opposite sides or beyond the four sides of the first part 207 and can be of several parts.

The encapsulating block 206 covers the chip 204 and extends to the peripheral edge of the part 207 while covering the internal portion of the part 209.

In an equivalent manner to the electronic devices described previously, first electrical connection elements 212 are interposed between first front electrical contacts of the chip 204 and rear electrical contacts of the first network of electrical connections 208 of the part 207 of the support wafer 205. Second electrical connection elements 213 are interposed between second front electrical contacts of the chip 204 and internal rear zones 213a forming rear electrical contacts of the tracks 211 of the second network of electrical connections 210 of the part 209 of the support wafer 105.

The electronic device 202 is mounted on the electronic board 203 in the following manner.

Electrical connection elements 214 are interposed between front electrical contacts of the first network of electrical connections 208 of the part 207 of the support wafer 205 and electrical contacts of a first network of electrical connections 215, these electrical contacts being included in a face 216 of the electronic board 203.

The overhanging external portion of the part 209 of the support wafer 205 is folded so that an end of this overhanging external portion is adjacent to the face 216 of the electronic board 203.

Electrical connection elements 217 are interposed between uncovered front external zones 217a of the tracks 211 and electrical contacts of a second network of electrical connections 218 of the electronic board, these electrical contacts being included in the face 216 of the electronic board 203.

According to another exemplary embodiment (not represented), the electronic board 203 can exhibit a cavity in which the part 207 is engaged, in an equivalent manner to the previously described examples with cavity. The depth of this cavity can be adapted so that the whole of the overhanging external portion of the part 209 of the support wafer 205 is in alignment with the internal portion of this part 209.

The invention claimed is:

1. An electronic device, comprising:
a support wafer having a front face and a rear face, the support wafer including a first network of electrical connections which establish electrical connections from the front face to the rear face, and a second network of electrical connections which comprises solely tracks;
an electronic chip having a front face which faces the rear face of the support wafer;
first electrical connection elements interposed between first front electrical contacts of the electronic chip and rear electrical contacts of the first network of electrical connections of the support wafer;
second electrical connection elements interposed between second front electrical contacts of the electronic chip and internal electrical contact zones of the tracks of the second network of electrical connections of the support wafer; and
an encapsulating block for encapsulating the electronic chip above the support wafer;

wherein the first network of electrical connections of the support wafer comprises front external electrical contacts and the tracks of the second network of electrical connections of the support wafer further include external electrical contact zones; and wherein the support wafer includes at least one recess extending in from the front face to uncover the external electrical contact zones which comprise surfaces of the tracks of the second network of electrical connections, said surfaces facing away from the electronic chip.

2. The device according to claim 1, wherein the external electrical contact zones of the tracks are situated in correspondence with a peripheral region of the encapsulating block.

3. The device according to claim 1, wherein the support wafer comprises a first part provided with the first network of electrical connections and a second part provided with the second network of electrical connections and includes an internal portion between the encapsulating block and the first part and an external portion extending beyond the periphery of the encapsulating block and the first part.

4. The device according to claim 3, wherein the second part of the support wafer comprises at least one film provided with the second network of electrical connections.

5. The device according to claim 1, wherein the first front electrical contacts are in a middle region of the front face of the electronic chip and the second front electrical contacts of the electronic chip are in a peripheral region of the front face of the electronic chip which surrounds the middle region.

6. The device according to claim 1, wherein the first electrical contacts of the electronic chip are electrical power supply contacts and the second electrical contacts of the electronic chip are contacts for exchanges of electrical signals.

7. A device, comprising:
an electronic board having a first network of electrical connections and a second network of electrical connections;
a support wafer having a front face and a rear face, the support wafer including a third network of electrical connections which establish electrical connections from the front face to the rear face and include front external electrical contacts, and a fourth network of electrical connections which comprises solely tracks which include external electrical contact zones;
an electronic chip having a front face which faces the rear face of the support wafer;
first electrical connection elements interposed between first front electrical contacts of the electronic chip and rear electrical contacts of the third network of electrical connections of the support wafer;
second electrical connection elements interposed between second front electrical contacts of the electronic chip and internal electrical contact zones of the tracks of the fourth network of electrical connections of the support wafer; and
an encapsulating block for encapsulating the electronic chip above the support wafer;
wherein said support wafer is mounted to the electronic board with the front electrical contacts of the first network of electrical connections of the support wafer electrically connected to the third network of electrical connections of the electronic board and with the external electrical contact zones of the tracks of the fourth network of electrical connections electrically connected to second network of electrical connections of the electronic board.

8. The device according to claim 7, wherein the electronic board includes a recess, and wherein the support wafer of the electronic device is mounted within said recess of the electronic board.

9. The device according to claim 8, wherein the first network of electrical connections of the electronic board is located within the recess and the second network of electrical connections of the electronic board is located outside of the recess.

10. The device according to claim 7, further comprising an intermediate annulus provided with electrical connection branches that connect the external electrical contact zones of the tracks with electrical contacts of the second network of electrical connections of the electronic board.

11. The device according to claim 7, wherein the support wafer comprises a first part provided with the third network of electrical connections and a second part provided with the fourth network of electrical connections and includes an internal portion between the encapsulating block and the first part and an external portion extending beyond the periphery of the encapsulating block and the first part.

12. The device according to claim 11, wherein the second part of the support wafer comprises at least one film provided with the fourth network of electrical connections, said film extending to electrically connect to the second network of electrical connections of the electronic board.

13. The device according to claim 7, wherein the support wafer includes at least one recess extending in from the front face to uncover the external electrical contact zones which comprise surfaces of the tracks of the fourth network of electrical connections, said surfaces facing away from the electronic chip.

14. The device according to claim 13, wherein the external electrical contact zones of the tracks are situated in correspondence with a peripheral region of the encapsulating block.

15. The device according to claim 7, wherein the support wafer extends beyond a peripheral edge of the encapsulating block, and the external electrical contact zones of the tracks of the fourth network of electrical connections comprise surfaces, said surfaces facing towards the electronic chip in an annular region surrounding the peripheral edge of the encapsulating block.

16. The device according to claim 7, wherein the support wafer comprises a first part provided with the third network of electrical connections and a second part provided with the fourth network of electrical connections and includes an internal portion between the encapsulating block and the first part and an external portion extending beyond the periphery of the encapsulating block and the first part.

17. The device according to claim 16, wherein the second part of the support wafer comprises at least one film provided with the fourth network of electrical connections.

18. The device according to claim 17 wherein the first electrical contacts of the electronic chip are electrical power supply contacts and the second electrical contacts of the electronic chip are contacts for exchanges of electrical signals.

19. The device according to claim 7, wherein the first front electrical contacts are in a middle region of the front face of the electronic chip and the second front electrical contacts of the electronic chip are in a peripheral region of the front face of the electronic chip which surrounds the middle region.

* * * * *